United States Patent
Lee et al.

(10) Patent No.: US 10,868,477 B2
(45) Date of Patent: Dec. 15, 2020

(54) POWER CONVERSION APPARATUS AND UNINTERRUPTIBLE POWER SUPPLY COMPRISING SAME

(71) Applicant: SAMSUNG SDI CO., LTD., Yongin-si, Gyeonggi-do (KR)

(72) Inventors: Youngjin Lee, Yongin-si (KR); Seunglim Choi, Yongin-si (KR); Buangho Park, Yongin-si (KR); Gilchoun Yeom, Yongin-si (KR); Taejong Lee, Yongin-si (KR); Woojoon Chung, Yongin-si (KR); Hyeoncheol Jeong, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 16/467,874

(22) PCT Filed: Oct. 16, 2017

(86) PCT No.: PCT/KR2017/011361
§ 371 (c)(1),
(2) Date: Jun. 7, 2019

(87) PCT Pub. No.: WO2018/105875
PCT Pub. Date: Jun. 14, 2018

(65) Prior Publication Data
US 2020/0076324 A1 Mar. 5, 2020

(30) Foreign Application Priority Data
Dec. 9, 2016 (KR) .................. 10-2016-0167802

(51) Int. Cl.
*H02M 7/5387* (2007.01)
*G01R 15/18* (2006.01)
(Continued)

(52) U.S. Cl.
CPC .......... *H02M 7/5387* (2013.01); *G01R 15/18* (2013.01); *G01R 15/202* (2013.01); *H02J 9/062* (2013.01);
(Continued)

(58) Field of Classification Search
CPC ....... H02M 7/5387; H02M 2001/0009; H02M 7/53; H02M 7/537; H02M 7/53871
See application file for complete search history.

(56) References Cited

U.S. PATENT DOCUMENTS

2010/0320923 A1 12/2010 Miyazaki et al.
2017/0110987 A1* 4/2017 Ghosh ..................... H02M 1/08
(Continued)

FOREIGN PATENT DOCUMENTS

JP  06-078552 A  3/1994
JP  2010-004623 A  1/2010
(Continued)

OTHER PUBLICATIONS

International Search Report dated Jan. 22, 2018 for PCT/KR2017/011361.

*Primary Examiner* — Gary L Laxton
(74) *Attorney, Agent, or Firm* — Lee IP Law, PC

(57) ABSTRACT

There is provided a power conversion apparatus including first to fifth nodes. The power conversion apparatus includes: an inverter including a first switch between the first and second nodes, a second switch between the first and third nodes, a third switch between the second and fourth nodes, and a fourth switch between the third and fourth nodes; a filter including an inductor connected between the second and fifth nodes and a capacitor connected between the fifth and third nodes; and a current sensor configured to sense resultant current, which is the sum of inductor current flowing in the inductor and output current, wherein the (Continued)

output current is output to a load connected between the third and fifth nodes.

7 Claims, 7 Drawing Sheets

(51) Int. Cl.
    *G01R 15/20*     (2006.01)
    *H02J 9/06*     (2006.01)
    *H02M 1/00*     (2006.01)

(52) U.S. Cl.
    CPC ...... *H02M 1/00* (2013.01); *H02M 2001/0009* (2013.01); *H02M 2001/0064* (2013.01)

(56) References Cited

U.S. PATENT DOCUMENTS

| | | | |
|---|---|---|---|
| 2018/0062497 A1* | 3/2018 | Murakami | H02M 7/53871 |
| 2018/0358907 A1* | 12/2018 | Kato | H02M 1/126 |
| 2019/0081575 A1* | 3/2019 | Shimizu | H02M 7/48 |

FOREIGN PATENT DOCUMENTS

| | | |
|---|---|---|
| JP | 2016-046946 A | 4/2016 |
| KR | 10-2014-0009914 A | 1/2014 |
| KR | 10-139235 B1 | 4/2014 |
| KR | 10-2015-0061248 A | 6/2015 |
| KR | 10-2015-0106838 A | 9/2015 |
| KR | 10-2016-0023220 A | 3/2016 |

\* cited by examiner

POWER CONVERSION APPARATUS AND UNINTERRUPTIBLE POWER SUPPLY COMPRISING SAME

CROSS-REFERENCE TO THE RELATED APPLICATION

This is the U.S. national phase application based on PCT Application No. PCT/KR2017/011361, filed Oct. 16, 2017, which is based on Korean Patent Application No. 10-2016-0167802, filed Dec. 9, 2016, the entire contents of all of which are hereby incorporated by reference.

TECHNICAL FIELD

The present disclosure relates to a power conversion apparatus and an uninterruptible power supply including the power conversion apparatus.

BACKGROUND ART

When a grid is abnormal and unable to normally supply power to loads, an uninterruptible power supply is used to supply power to the loads in place of the grid. Such an uninterruptible power supply includes a power conversion apparatus for converting DC power into AC power. The uninterruptible power supply may detect inductor current flowing to an inductor in the power conversion apparatus and output current output from the power conversion apparatus to a load, and based on the detected inductor current and the output current, the uninterruptible power supply may control output power according to variations in the power consumption of the load.

However, when the uninterruptible power supply measures the inductor current and the output current with two current sensors, errors occur because of different internal characteristics of the two current sensors, and a phase delay arises as the inductor current and the output current measured by the two sensors are synchronized.

DESCRIPTION OF EMBODIMENTS

Technical Problem

Objectives of the present disclosure is to provide an inverter and an uninterruptible power supply that are configured to measure resultant current which is the sum of inductor current to be input to an inverter and output current by using a single current sensor and separate and restore the inductor current and the output current based on the resultant current without errors caused by different internal characteristics of current sensors and a phase delay occurring when sensed current values are synchronized.

Solution to Problem

According to an aspect of the present disclosure, a power conversion apparatus includes first to fifth nodes, wherein a battery configured to supply DC power is connected to the first and fourth nodes, and AC power obtained by converting the DC power is output through the third and fifth nodes, wherein the power conversion apparatus includes: an inverter including a first switch between the first and second nodes, a second switch between the first and third nodes, a third switch between the second and fourth nodes, and a fourth switch between the third and fourth nodes; a filter including an inductor connected between the second and fifth nodes and a capacitor connected between the fifth and third nodes; and a current sensor configured to sense resultant current, which is a sum of inductor current flowing in the inductor and output current, wherein the output current is output to a load connected between the third and fifth nodes.

According to an example, the power conversion apparatus further includes a first path providing a path through which current flows between the first and third nodes; a second path providing a path through which current flows between the third and fourth nodes; and a third path providing a path through which the output current flows.

According to another example of the power conversion apparatus, the third path passes through a position adjacent to the first path, and the current sensor is placed at a position corresponding to the adjacent position such that the resultant current, which is the sum of the inductor current and the output current, is sensed.

According to another example of the power conversion apparatus, the third path passes through a position adjacent to the second path, and the current sensor is placed at a position corresponding to the adjacent position such that the resultant current, which is the sum of the inductor current and the output current, is sensed.

According to another example of the power conversion apparatus, in a first mode, the inverter turns on the first and fourth switches and turns off the second and third switches, and in a second mode, the inverter turns off the first and fourth switches and turns on the second and third switches, wherein in the first mode, the current sensor senses first resultant current, which is the sum of the inductor current and the output current, and in the second mode, the current sensor senses second resultant current, which is the output current.

According to another example of the power conversion apparatus, the current sensor includes at least one of an ammeter configured to sense current using a Hall device and an ammeter configured to sense current by a current transformer method.

According to an aspect of the present disclosure, an uninterruptible power supply includes: an inverter including first to fourth nodes, a first switch between the first and second nodes, a second switch between the first and third nodes, a third switch between the second and fourth nodes, and a fourth switch between the third and fourth nodes, the inverter being configured to convert DC power into AC power by controlling the first to fourth switches; a battery connected between the first and fourth nodes and including at least one battery cell; a filter connected between the second and third nodes, the filter including an inductor between the second node and a fifth node and a capacitor between the fifth node and the third node; and a current sensor configured to sense resultant current, which is a sum of inductor current flowing in the inductor and output current, wherein the output current is output to a load connected between the third and fifth nodes.

Another example of the uninterruptible power supply further includes a first path providing a path through which current flows between the first and third nodes, a second path providing a path through which current flows between the third and fourth nodes, and a third path providing a path through which the output current flows.

According to another example of the uninterruptible power supply, the third path passes through a first position adjacent to the first path, and the current sensor is placed at a position corresponding to the first position such that the resultant current, which is the sum of the inductor current and the output current, is sensed.

According to another example of the uninterruptible power supply, the third path passes through a second position adjacent to the second path, and the current sensor is placed at a position corresponding to the second position such that the resultant current, which is the sum of the inductor current and the output current, is sensed.

Another example of the uninterruptible power supply further includes a controller configured to receive information about the resultant current sensed by the current sensor and restore the inductor current and the output current by separating the inductor current and the output current based on the information about the resultant current.

According to another example of the uninterruptible power supply, the inverter periodically and repeatedly operates in a first mode and a second mode in such a manner that the inverter turns on the first and fourth switches and turns off the second and third switches in the first mode, and turns off the first and fourth switches and turns on the second and third switches in the second mode.

According to another example of the uninterruptible power supply, the controller is configured to restore the inductor current and the output current by removing second resultant current sensed in the second mode from first resultant current sensed in the first mode.

Advantageous Effects of Disclosure

According to various embodiments, the inverter and the uninterruptible power supply may measure resultant current which is the sum of inductor current to be input to the inverter and output current by using the current sensor and separate and restore the inductor current and the output current based on the resultant current without errors caused by different internal characteristics of current sensors and a phase delay occurring when sensed current values are synchronized.

MODE OF DISCLOSURE

Figure 1:
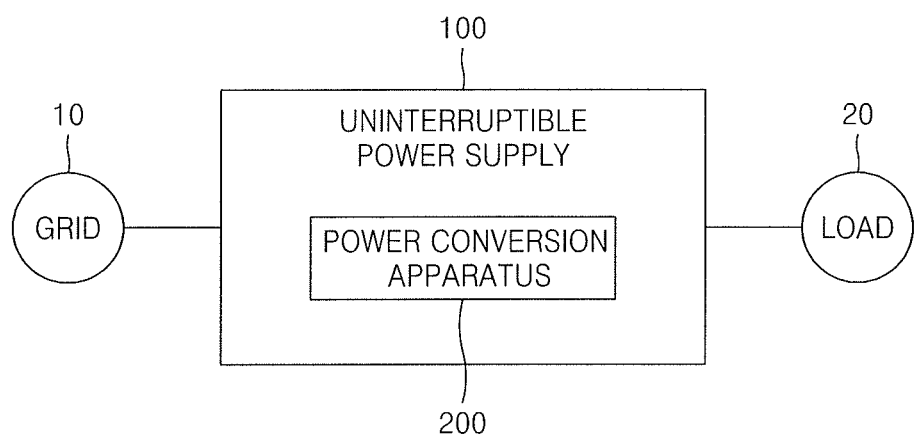
FIG. 1 is a schematic view illustrating an uninterruptible power supply and peripheral structures thereof according to an embodiment of the present disclosure.

Advantages and features of the present disclosure, and implementation methods thereof will be clarified through the following descriptions given with reference to the accompanying drawings. However, the following embodiments of the present disclosure are non-limiting examples and may have different forms, and it should be understood that the idea and technical scope of the present disclosure cover all the modifications, equivalents, and replacements. Rather, these embodiments are provided so that this disclosure will be thorough and complete, and will fully convey the scope of the present disclosure to those skilled in the art. Moreover, detailed descriptions related to well-known functions or configurations will be omitted in order not to unnecessarily obscure subject matters of the present disclosure.

For example, specific shapes, structures, and features described in one example embodiment may be modified in another example embodiment without departing from the scope of the present disclosure. In addition, the positions or arrangement of elements described in one example embodiment may be changed in another example embodiment within the scope of the present disclosure. That is, the following description is provided for illustrative purposes only and is not intended to limit the scope of the present disclosure. The scope of the present disclosure is defined by the claims and equivalents thereof. In the drawings, like reference numerals denote like elements. Details described in the present disclosure are examples. That is, such details may be changed in other example embodiments within the spirit and scope of the present disclosure.

It will be understood that although the terms "first," "second," etc. may be used herein to describe various elements, these elements should not be limited by these terms. These terms are only used to distinguish one element from another.

The terminology used herein is for explaining specific embodiments only and is not intended to limit the scope of the present disclosure. The terms of a singular form may include plural forms unless otherwise mentioned. It will be understood that terms such as "comprise," "include," and "have," when used herein, specify the presence of state features, integers, steps, operations, elements, components, or combinations thereof, but do not preclude the presence or addition of one or more other features, integers, steps, operations, elements, components, or combinations thereof. It will be understood that although the terms "first" and "second" are used herein to describe various elements, these elements should not be limited by these terms. These terms are only used to distinguish one element or component from other elements or components.

Hereinafter, example embodiments will be described in detail with reference to the accompanying drawings. In the drawings, like reference numerals denote like elements, and overlapping descriptions thereof will be omitted.

FIG. 1 is a schematic view illustrating an uninterruptible power supply 100 and peripheral structures thereof according to an embodiment of the present disclosure.

A grid 10 includes power plants, substations, transmission lines, etc. In a normal state, the grid 10 supplies power to a load 20 and/or a battery 130 of the uninterruptible power supply 100. However, when the grid 10 is in an abnormal state, power is not supplied from the grid 10 to the uninterruptible power supply 100, and thus power is supplied from the battery 130 of the uninterruptible power supply 100 to the load 20.

The load 20 consumes electricity supplied from the grid 10 and/or stored in the battery 130. A home or plant may be an example of the load 20.

The uninterruptible power supply 100 is an automatic system configured to immediately supply power without interruption in the case of a power outage or failure. The uninterruptible power supply 100 may be an integral part of an electronic device such as a computer requiring continuous supply of power when in use, and even in the case of voltage or frequency variations or a momentary power failure, the uninterruptible power supply 100 may stably supply power to protect computer data and prevent destruction or deletion of computer data and shutdown or malfunction of various control devices.

According to the embodiment, although the grid 10 is not in an abnormal state, the uninterruptible power supply 100 may supply power to the load 20 as an energy storage device. That is, in a normal state, the uninterruptible power supply 100 may be used as an energy storage device. Even in a normal state, the battery 130 of the uninterruptible power supply 100 may supply power to the load 20 together with the grid 10 by taking into consideration the peak hours of power consumption or the price of electricity supplied from the grid 10. The battery 130 may be charged with midnight electricity supplied from the grid 10. However, since the uninterruptible power supply 100 has to continuously supply power even when it is difficult to receive power from the grid 10, although the uninterruptible power supply 100 operates as an energy storage device in a normal state, it is necessary for the uninterruptible power supply 100 to store electricity in a certain amount or greater.

Figure 2:
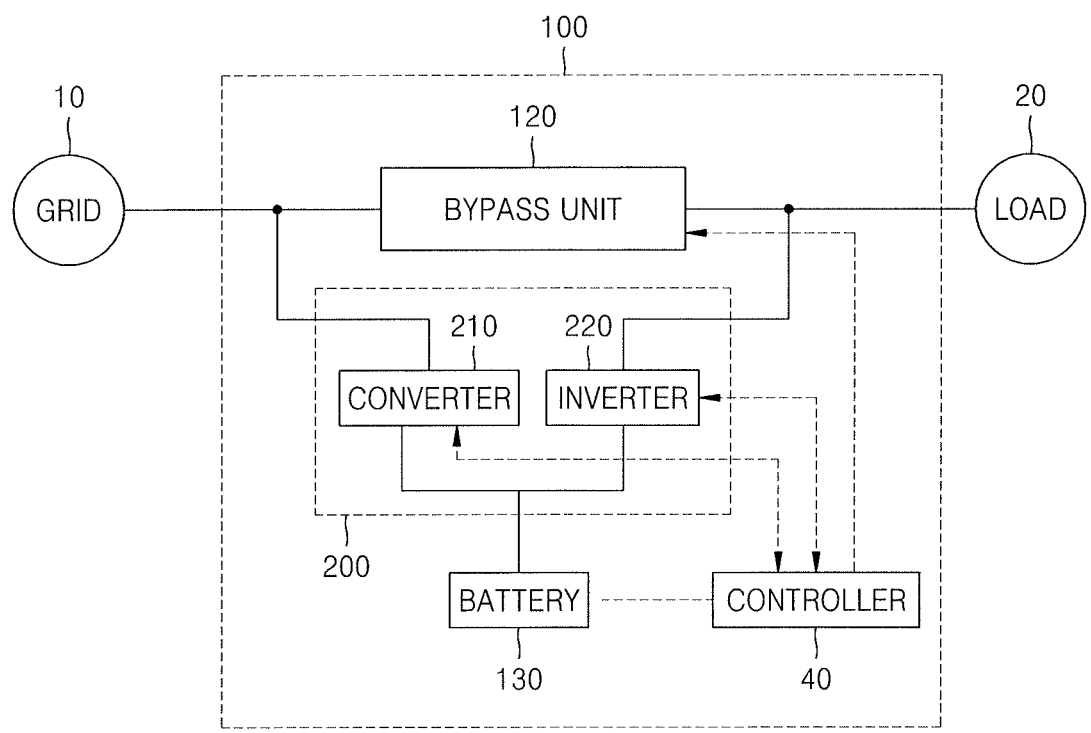
FIG. 2 is a block diagram illustrating a structure of the uninterruptible power supply according to an embodiment of the present disclosure.

FIG. 2 is a block diagram illustrating a structure of the uninterruptible power supply 100 according to an embodiment of the present disclosure.

Referring to FIG. 2, the uninterruptible power supply 100 includes a converter 210, an inverter 220, a controller 40, and the battery 130.

The inverter 220 is connected between the load 20 and the battery 130. In a discharge mode, the inverter 220 may convert DC voltage output from the battery 130 into AC voltage according to the type of voltage of the grid 10. In addition, the inverter 220 may be a bi-directional inverter having invertible input and output sides.

The inverter 220 may include a filter to remove harmonics from AC voltage to be output to the load 20. In addition, the inverter 220 may include a phase locked loop (PLL) circuit to synchronize the phase of AC voltage output from the inverter 220 with the phase of AC voltage of the grid 10 and thus to reduce reactive power. In addition, the inverter 220 may have a function such as limiting the range of voltage variations, improving a power factor, removing a DC component, or protection during a transient phenomena. The operation of the inverter 220 may be stopped when the inverter 103 is not used to minimize power consumption.

In a charge mode, the converter 210 rectifies AC voltage of the grid 10 as DC voltage to store electricity of the grid 10 in the battery 130. The converter 210 may include a semiconductor rectifier, an electron tube rectifier, a mechanical rectifier, an AC-DC converter, or the like.

A bypass unit 120 is connected between the grid 10 and the load 20. The bypass unit 120 may form a power supply path separate from a power supply path formed by the uninterruptible power supply 100 between the grid 10 and the load 20. The bypass unit 120 may allow for supply of power from the grid 10 to the load 20 through the uninterruptible power supply 100 or direct supply of power from the grid 10 to the load 20. The bypass unit 120 may include a relay switch. When the phase of power of the grid 10 is abnormal or the grid 10 supplies power abnormally, the bypass unit 120 may interrupt the power supply path between the grid 10 and the load 20. When the power of the grid 10 is normal, the bypass unit 120 may provide the power supply path to allow for direct supply of power from the grid 10 to the load 20.

A DC link may be further provided between the converter 210 and the battery 130 and between the inverter 220 and the battery 130. The DC link is connected between the converter 210 and the inverter 220 for maintaining DC link voltage at a constant level. The level of the DC link voltage may become unstable in the case of an event such as a momentary voltage drop at the grid 10 or a peak in the load 20. It is necessary to stabilize the DC link voltage for stable operations of the inverter 220 and the battery 130. To this end, the DC link is connected among the battery 130, the inverter 220, and the converter 210, and for example, the DC link may include a high-capacitance capacitor.

The controller 40 monitors states of the grid 10, the battery 130, and the load 20, and controls operations of the inverter 220, the converter 210, and the battery 130 according to results of the monitoring, a preset algorithm, etc. The controller 40 may monitor the occurrence of a power failure in the grid 10, the state of charge of the battery 130, the amount of power consumption of the load 20, time, etc. In addition, when the amount of electricity to be supplied to the load 20 is insufficient, for example, due to a power failure in the grid 10, the controller 40 may determine the priories of power-consuming devices of the load 20 and may control the load 20 so that power may be supplied to power-consuming devices of the load 20 having high priorities.

The battery 130 may be charged by power supplied from the grid 10 through the DC link or may supply power to the load 20 or the grid 10. The converter 210 may convert AC power supplied from the grid 10 into DC power, and the battery 130 may be charged with the DC power. DC power output from the battery 130 is converted into AC power by the inverter 220, and the AC power is supplied to the load 20. The AC power output from the inverter 220 has a frequency corresponding to the frequency of AC power supplied from the grid 10.

The battery 130 stores electricity and includes at least one battery cell. The battery 130 may include a plurality of battery cells, and the battery cells may be connected in series, parallel, or series-parallel to each other. The number of battery cells of the battery 130 and the method of connecting the battery cells of the battery 130 may be determined according to a required output voltage and a required electricity storage capacity.

The battery cells may include rechargeable secondary battery cells. For example, the battery cells may include nickel-cadmium battery cells, lead battery cells, nickel metal hydride (NiMH) battery cells, lithium-ion battery cells, lithium polymer battery cells, or the like. However, the battery cells are not limited thereto.

Figure 3:
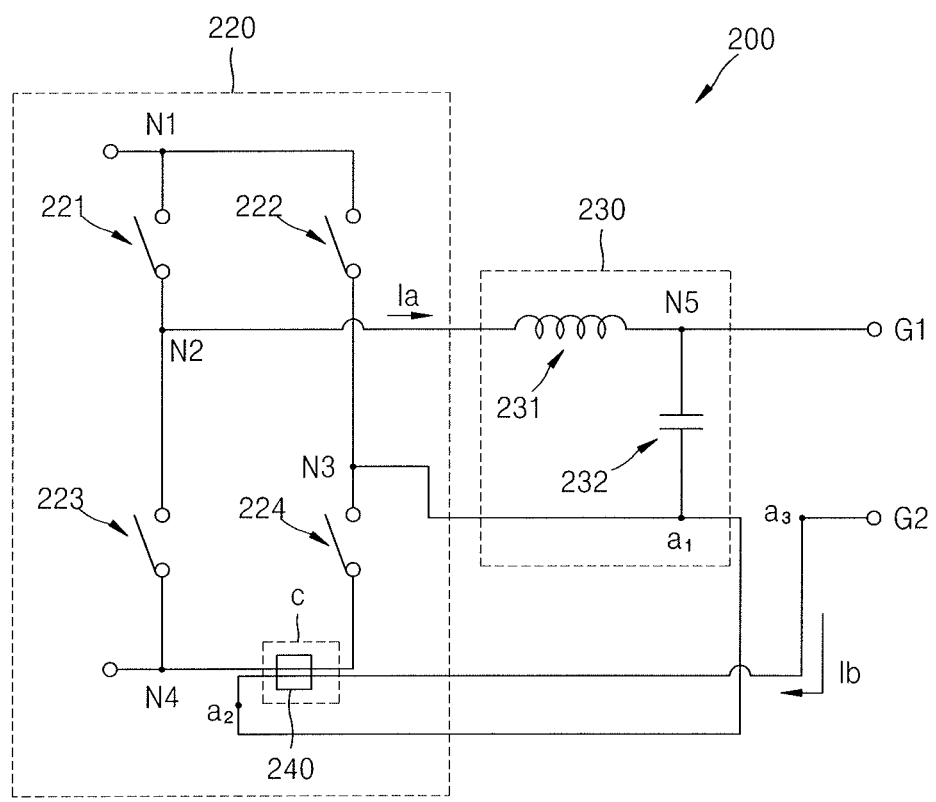
FIG. 3 is a schematic view illustrating an internal structure of a power conversion apparatus according to an embodiment of the present disclosure.

FIG. 3 is a schematic view illustrating an internal structure of a power conversion apparatus 200 according to an embodiment of the present disclosure.

Referring to FIG. 3, the power conversion apparatus 200 includes an inverter 220, a filter 230, and a current sensor 240.

The power conversion apparatus 200 may be connected to a battery 130 that supplies DC power and may convert the DC power of the battery 130 into AC power.

The inverter 220 includes first to fourth nodes N1 to N4, first to fourth switches 221 to 224, and first to third paths. The battery 130, which supplies DC power, is connected to the first node N1 and the fourth node N4, and AC power converted from the DC power is output through the second node N2 and the third node N3.

The first switch 221 is placed between the first node N1 and the second node N2. The second switch 222 is placed between the first node N1 and the third node N3. The third switch 223 is placed between the second node N2 and the fourth node N4. The fourth switch 224 is placed between the third node N3 and the fourth node N4.

In a first mode, the inverter 220 turns on the first switch 221 and the fourth switch 224 and turns off the second switch 222 and the third switch 223. In a second mode, the inverter 220 turns off the first switch 221 and the fourth switch 224 and turns on the second switch 222 and the third switch 223. In this manner, the inverter 220 may convert DC power into AC power while repeatedly operating between the first mode and the second mode. That is, the inverter 220 switches from the first mode to the second mode, and then from the second mode to the first mode. That is, the inverter 220 operates while periodically repeatedly switching between the modes.

According to an embodiment, the inverter 220 outputs current flowing from the second node N2 to the third node N3 in the first mode and outputs current flowing from the third node N3 to the second node N2 in the second mode. In other words, current output in the first mode is reversed current that has a magnitude corresponding to the magnitude of current output in the second mode and flows in a direction different from the direction in which the current output in the second mode flows. The inverter 220 may alternately operate in the first and second modes to output square-wave (pulse-type) current.

The filter 230 may convert the square-wave current output from the inverter 220 into current having a waveform corresponding to the waveform of commercial AC current that the grid 10 supplies. The filter 230 is connected in parallel between the second node N2 and the third node N3 of the inverter 220. The filter 230 includes an inductor 231 and a capacitor 232. The inductor 231 is connected between the second node N2 and a fifth node N5, and the capacitor 232 is connected between the fifth node N5 and the third node N3.

A first output terminal is connected to the fifth node N5, and a second output terminal is connected to the third node N3. A load 20 is connected between the first output terminal and the second output terminal and is supplied with output current Ib.

In addition, current output to the second node N2 and the third node N3 of the inverter 220 is transmitted to the inductor 231. In the first mode of the inverter 220, current flowing between the third node N3 and the fourth node N4 is output to the second node N2 and the third node N3, and in the second mode of the inverter 220, current flowing between the first node N1 and the third node N3 is outputted to the second node N2 and the third node N3. Hereinafter, current flows to the inductor 231 in the first mode and the second mode will be referred to as inductor current Ia.

According to an embodiment, in the first mode, inductor current Ia flows sequentially through the first node N1, the first switch 221, the inductor 231, the capacitor 232 and the second output terminal, the fourth switch 224, and the fourth node N4. In the second mode, inductor current Ia flows sequentially through the first node N1, the second switch 222, the capacitor 232 and the first output terminal, the inductor 231, the third switch 223, and the fourth node N4. Inductor current Ia in the second mode has a waveform and magnitude corresponding to the waveform and magnitude of current obtained by phase-shifting inductor current Ia in the first mode by 180 degrees.

The first path provides a path through which current flows between the first node N1 and the third node N3. The first path provides a path through which inductor current Ia flows in the second mode and is cut off in the first mode. The second path provides a path through which current flows between the third node N3 and the fourth node N4. The second path provides a path through which inductor current Ia flows in the first mode and is cut off in the second mode.

The third path provides a path through which output current Ib flows. The third path provides a path through which output current Ib flows between the third node N3 and the second output terminal. The third path passes through a first point a1, a second point a2, and a third point a3, and also passes through a first position C, which is adjacent to the second path. The third path provides a path for output current Ib flowing from the third point a3 to the first point a1 in the first mode and provides a path for output current Ib flowing from the first point a1 to the third point a3 in the second mode.

The current sensor 240 is placed at a position corresponding to the first position C. The position corresponding to the first position refers to a position at which the current sensor 240 may sense resultant current which is the sum of current flowing in the second path and current flowing in the third path. The position corresponding to the first position encompasses the first position and a position adjacent to the first position. Specifically, the current sensor 240 is placed at a position at which the current sensor 240 may measure the sum of current flowing in a path between the third point a3 and the first point a1 of the third path and current flowing in the second path. In this case, in the first mode, inductor current Ia flowing in the second path has the same direction as output current Ib flowing in a path between the first point a1 and the third point a3. The current sensor 240 may sense the sum of inductor current Ia and output current Ib. For example, the current sensor 240 may be arranged at the position corresponding to the first position to surround the second path and the path between the third point a3 and the first point a1 of the third path.

In addition, the current sensor 240 may include any one of a Hall device and an ammeter configured to measure current flowing in a path by a current transformer method.

Figure 4:
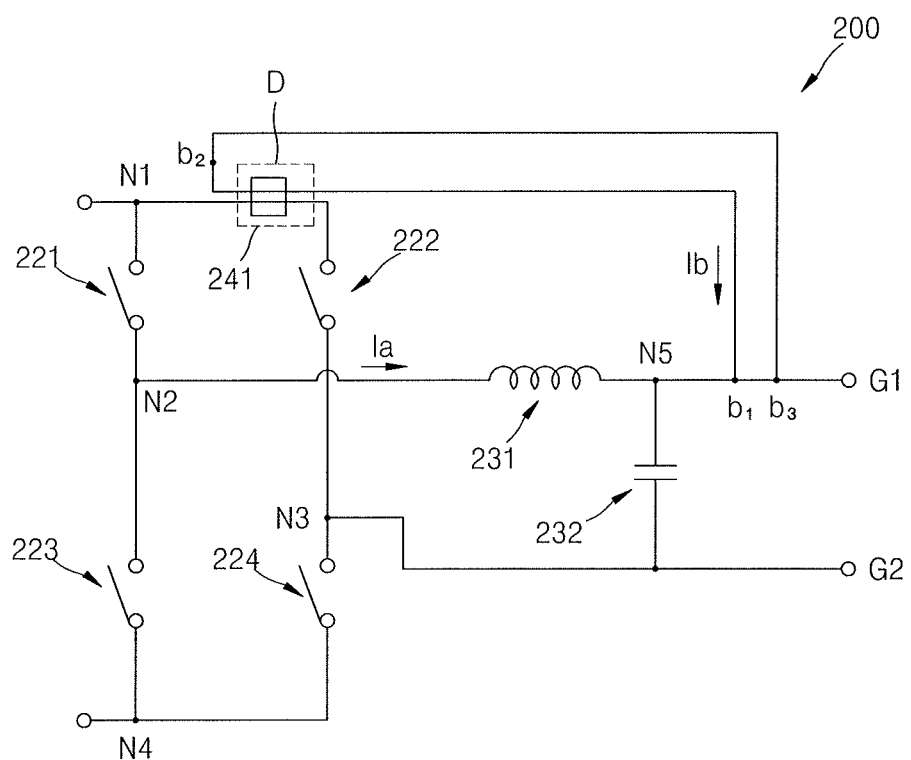
FIG. 4 is a schematic view illustrating an internal structure of a power conversion apparatus according to another embodiment of the present disclosure.

FIG. 4 is a schematic view illustrating an internal structure of a power conversion apparatus 200 according to another embodiment of the present disclosure.

Referring to FIG. 4, the power conversion apparatus 200 includes a current sensor 241, a first path, a second path, and a third path. The inverter 220, the filter 230, the current sensor 240, the first path, and the second path are substantially the same as the inverter 220, the filter 230, the current sensor 240, the first path, and the second path described with reference to FIG. 3. Thus, descriptions thereof will not be repeated here.

The third path may provide a path through which current flows between a fifth node N5 and a first output terminal, and specifically, the third path may provide a path through which output current Ib flows in first and second modes. The third path passes through a first-first point b1, a second-first point b2, and a third-first point b3, and also passes through a second position D, which is adjacent to the first path. The third path provides a path through which output current Ib flows from the first-first point b1 to the third-first point b3 in the first mode and a path through which output current Ib flows from the third-first point b3 to the first-first point b1 in the second mode.

The current sensor 240 is placed at a position corresponding to the second position D. The current sensor 240 is arranged at a position corresponding to the second position D and senses the sum of current flowing in the first path and current flowing in the third path. For example, the current sensor 240 senses resultant current, which is the sum of current flowing in a path between the third-first point b3 and the second-first point b2 of the third path and current flowing in the first path.

The inverter 220 shown in FIG. 4 may be described by the inverter 220 and the current sensor 240 of the embodiment shown in FIG. 3. Thus, the following description will be given mainly based on the power conversion apparatus 200 shown in FIG. 3.

Figure 5:
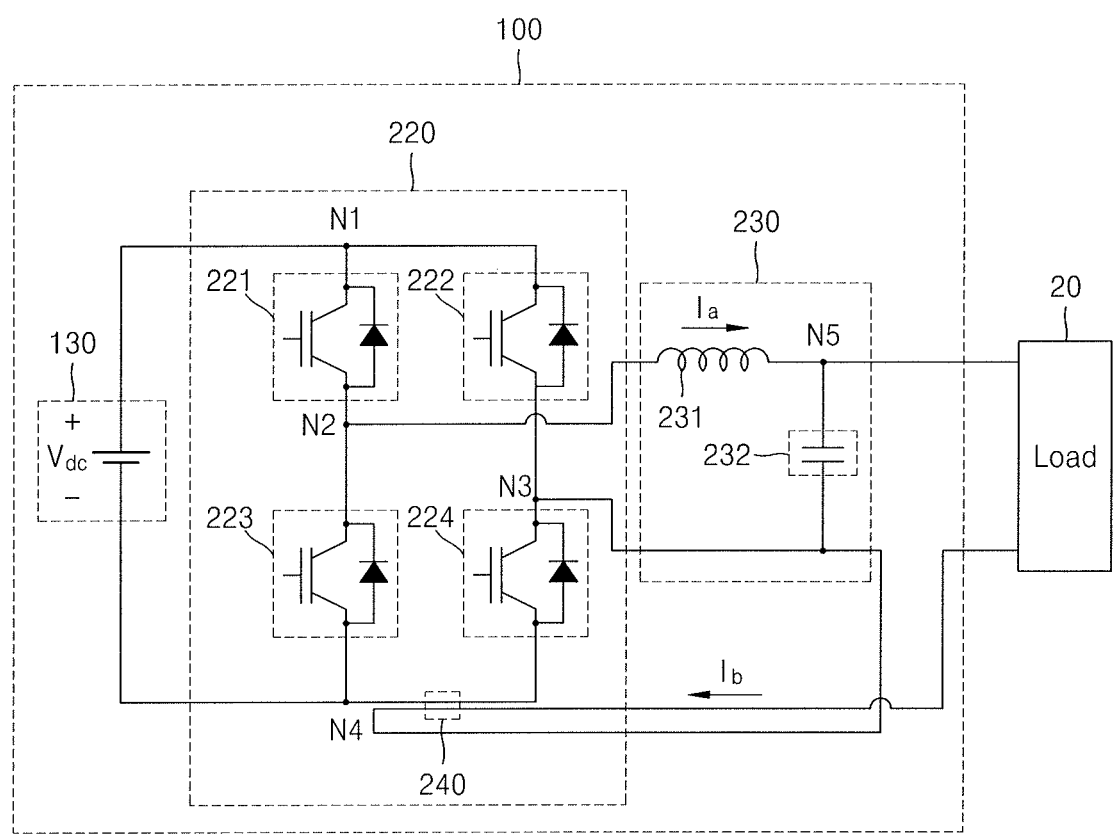
FIG. 5 is a schematic view illustrating an internal structure of an uninterruptible power supply according to an embodiment of the present disclosure.

FIG. 5 is a schematic view illustrating an internal structure of an uninterruptible power supply 100 according to an embodiment of the present disclosure.

Referring to FIG. 5, the uninterruptible power supply 100 includes a battery 130, an inverter 220, and a filter 230.

The uninterruptible power supply 100 senses output current Ib supplied to a load 20 and inductor current Ia applied to the inverter 220 using only a single current sensor, that is, the current sensor 240. The uninterruptible power supply 100 controls inductor current Ia such that the inductor current Ia may follow the sensed output current Ib. In this case, the uninterruptible power supply 100 may accurately measure the magnitude and phase differences between inductor current Ia and output current Ib and may thus supply high-quality output current Ib to the load 20 have.

In addition, when an uninterruptible power supply measures output current and inductor current with two current sensors, the uninterruptible power supply may not accurately measure the magnitude and phase differences between the inductor current and the output current. Specifically, when current sensors measure current, errors occur within a certain range according to internal characteristics of the current sensors. Current sensors have different internal characteristics, and thus, when two sensors sense current flowing in the same path, magnitudes of the current measured by the two sensors are different. In addition, the uninterruptible power supply requires a process of synchronizing inductor current and output current sensed by the two current sensors to detect the phase difference between the inductor current and the output current. In this case, as the switching frequency of switches included in an inverter of the uninterruptible power supply increases, output current having a phase delay with respect to actual output current is obtained in the synchronization process.

Unlike this, the uninterruptible power supply 100 restores output current Ib and inductor current Ia by using only the current sensor 240, and thus errors caused by different internal characteristics of current sensors and a phase delay occurring during a synchronization process may be prevented. The uninterruptible power supply 100 of the embodiment of the present disclosure may measure resultant current, which is the sum of output current Ib and inductor current Ia, by using only one current sensor, that is, the current sensor 240, and may restore the inductor current Ia and the output current Ib based on the resultant current. In this manner, the uninterruptible power supply 100 may supply inductor current Ia that accurately follows output current Ib.

The controller 40 receives a sensed current value from the current sensor 240. The controller 40 may separate and restore inductor current Ia and output current Ib based on the received sensed current value. The controller 40 may control the amount of AC power output from the inverter 220 based on the separated inductor current Ia and output current Ib.

Specifically, the controller 40 may restore inductor current Ia and output current Ib by calculating the difference between first resultant current measured in a first mode and second resultant current measured in a second mode. As described with reference to FIG. 3, in the first mode, inductor current Ia flows in the second path, and output current Ib to be supplied to the load 20 flows in the third path of the inverter 220. In this case, the current sensor 240 senses first resultant flow, which is the sum of inductor current Ia and output current Ib. Thereafter, in the second mode, inductor current Ia does not flow in the second path of the inverter 220 because a fourth switch 224 is opened, and output current Ib flows in the third path of the inverter 220. That is, in the second mode, the current sensor 240 only senses the output current Ib as second resultant current.

In this case, the second resultant current corresponds to the output current Ib, and the output current Ib in the second mode corresponds to reversed current obtained by phase-shifting the output current Ib in the first mode by 180 degrees. Thus, the controller 40 is capable of removing a portion corresponding to the output current Ib from the first resultant current. The controller 40 may separate the inductor current Ia from the first resultant current. The controller 40 may estimate inductor current Ia in the second mode by phase shifting the separated inductor current Ia by 180 degrees and may restore inductor current Ia in one cycle based on separated inductor current Ia in the first mode and separated inductor current Ia in the second mode. Likewise, the controller 40 may estimate output current Ib in the first mode by phase shifting output current Ib in the second mode by 180 degrees and may restore output current Ib in one cycle based on this. In the above description, one cycle refers to the case of repeating the first and second modes once.

The uninterruptible power supply 100 may separate and restore inductor current Ia and output current Ib from resultant current sensed by using only the current sensor 240, and thus errors caused by different internal characteristics of current sensors and a phase delay occurring during a synchronization process may be prevented.

In addition, the first to fourth switches 221 to 224 may include a FET switch and may each include a diode as shown in the drawings. The diode may serve as a recovery diode that transmits counter electromotive force back to a load.

Figure 6:
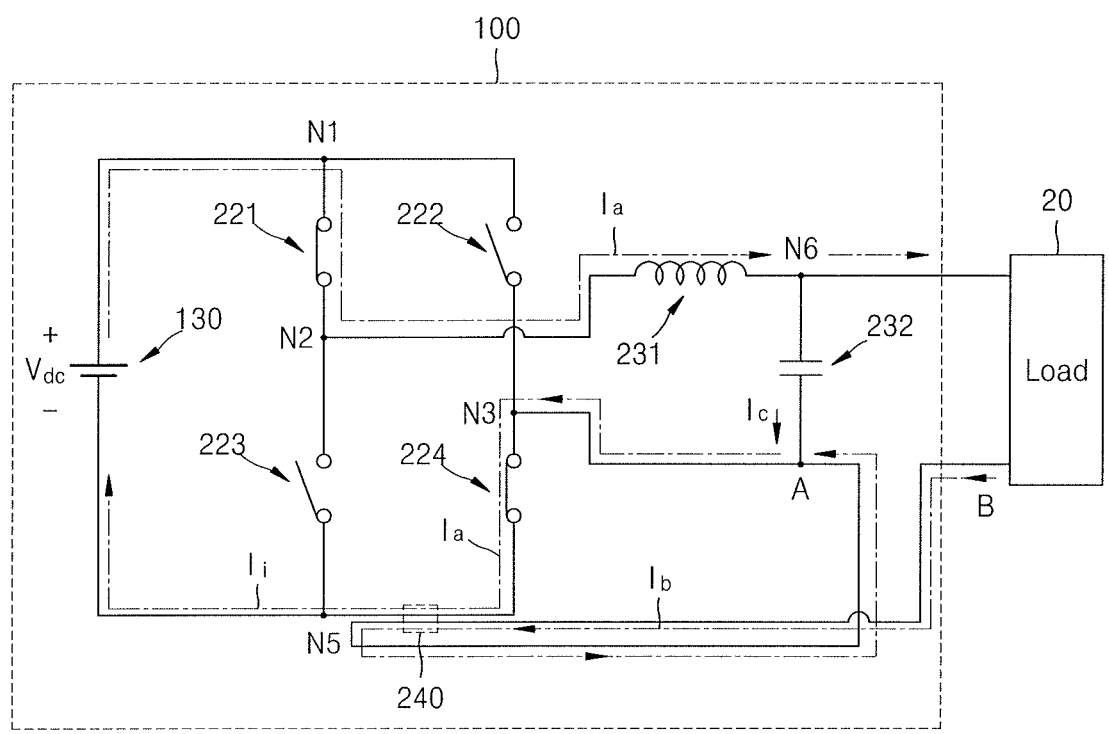
FIG. 6 is a schematic view illustrating flows of current in the uninterruptible power supply in a first mode according to an embodiment of the present disclosure.
Figure 7:
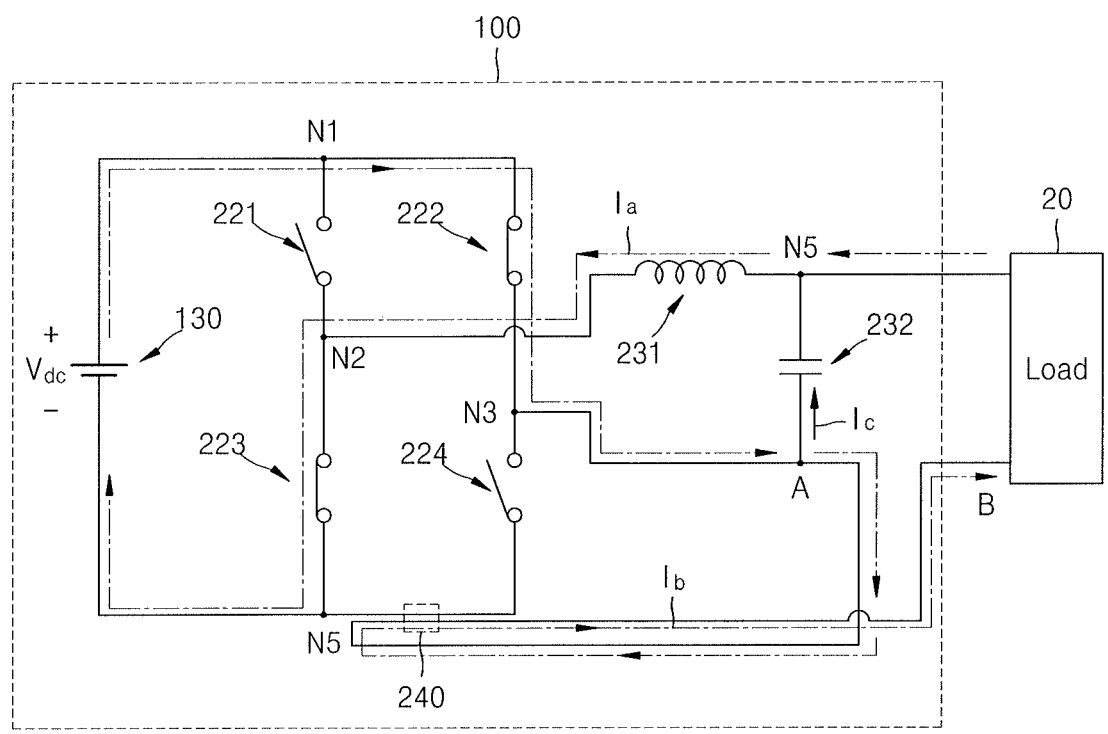
FIG. 7 is a schematic view illustrating flows of current in the uninterruptible power supply in a second mode according to an embodiment of the present disclosure.

FIG. 6 is a schematic view illustrating flows of current in the uninterruptible power supply 100 in the first mode according to an embodiment of the present disclosure, and FIG. 7 is a schematic view illustrating flows of current in the uninterruptible power supply 100 in the second mode according to an embodiment of the present disclosure.

Referring to FIGS. 6 and 7, the battery 130 is connected between the first node N1 and the fourth node N4 of the inverter 220, and the load 20 is connected between the third node N3 and the fifth node N5.

In the first mode, the inverter 220 turns on the first switch 221 and the fourth switch 224 and turns off the second switch 222 and the third switch 223. In the first mode, current flows in the inverter 220 sequentially through a positive electrode of the battery 130, the first switch 221, the inductor 231, the capacitor 232 and the load 20, the fourth switch 224, and a negative electrode of the battery 130.

In the first mode, inductor current Ia flows in the second path, and the inductor current Ia is divided into output current Ib flowing to the third path and current flowing to the capacitor 232. As shown in FIG. 3, the third path passes through the first position, which is adjacent to the second path, and extends to the second output terminal. In this case, the current sensor 240 senses first resultant current, which is the sum of inductor current Ia and output current Ib (refer to FIG. 6).

In the second mode, the first switch 221 and the fourth switch 224 are turned off and the second switch 222 and the third switch 223 are turned on. In the second mode, current flows sequentially through the positive electrode of the battery 130, the second switch 222, the capacitor 232 and the load 20, the inductor 231, the third switch 223, and the negative electrode of the battery 130. That is, output current Ib in the second mode has a reversed value of output current Ib in the first mode. In this case, the current sensor 240 senses output current Ib as first resultant current.

According to an embodiment, the controller 40 may remove output current Ib from first resultant current based on second resultant current. Specifically, the second resultant current is output current Ib in the second mode and corresponds to current obtained by reversing the output current Ib in the first mode. Therefore, the controller 40 may detect the output current Ib in the first mode based on the second resultant current. The controller 40 may restore inductor current Ia in the first mode by removing a portion corresponding to the detected output current Ib from the first resultant current. The controller 40 may detect inductor current Ia in the second mode based on inductor current Ia in the first mode.

In this manner, the uninterruptible power supply 100 may separate and restore inductor current Ia and output current Ib from resultant current sensed by using only the current sensor 240, and thus errors caused by different internal characteristics of current sensors and a phase delay occurring during a synchronization process may be prevented. Therefore, the uninterruptible power supply 100 may accurately detect output current Ib and inductor current Ia and may output current Ib immediately in response to variations in the power consumption of the load 20.

Preferable embodiments of the present disclosure have been mainly described. However, it will be apparent to those skilled in the art that various changes and modifications may be made without departing from the spirit and scope of the present disclosure. Therefore, the embodiments described herein should be considered in a descriptive sense only and not for purposes of limitation. The scope of the present disclosure is defined not by the above description but by the following claims, and all differences within equivalent ranges of the scope of the present disclosure should be considered as being included in the scope of the present disclosure.

The invention claimed is:

1. A power conversion apparatus having first to fifth nodes, wherein a battery configured to supply DC power is connected to the first and fourth nodes, and AC power obtained by converting the DC power is output through the third and fifth nodes,
wherein the power conversion apparatus comprises:
an inverter including a first switch between the first and second nodes, a second switch between the first and third nodes, a third switch between the second and fourth nodes, and a fourth switch between the third and fourth nodes;
a filter including an inductor connected between the second and fifth nodes and a capacitor connected between the fifth and third nodes;
a current sensor configured to sense resultant current, which is a sum of inductor current flowing in the inductor and output current, the output current being output to a load connected between the third and fifth nodes;
a first path providing a path through which current flows between the first and third nodes;
a second path providing a path through which current flows between the third and fourth nodes; and
a third path providing a path through which the output current flows, wherein:
the third path passes through a first position adjacent to the first path or passes through a second position adjacent to the second path, and
the current sensor is placed at a position corresponding to the first or the second position such that the resultant current, which is the sum of the inductor current and the output current, is sensed.

2. The power conversion apparatus as claimed in claim 1, wherein, in a first mode, the inverter turns on the first and fourth switches and turns off the second and third switches, and in a second mode, the inverter turns off the first and fourth switches and turns on the second and third switches,
wherein, in the first mode, the current sensor senses first resultant current, which is the sum of the inductor current and the output current, and in the second mode, the current sensor senses second resultant current, which is the output current.

3. The power conversion apparatus as claimed in claim 1, wherein the current sensor includes at least one of an ammeter configured to sense current using a Hall device and an ammeter configured to sense current by a current transformer method.

4. An uninterruptible power supply comprising:
an inverter including first to fourth nodes, a first switch between the first and second nodes, a second switch between the first and third nodes, a third switch between the second and fourth nodes, and a fourth switch between the third and fourth nodes, the inverter being configured to convert DC power into AC power by controlling the first to fourth switches;
a battery connected between the first and fourth nodes and including at least one battery cell;
a filter connected between the second and third nodes, the filter including an inductor between the second node and a fifth node and a capacitor between the fifth node and the third node;
a current sensor configured to sense resultant current, which is a sum of inductor current flowing in the inductor and output current, the output current being output to a load connected between the third and fifth nodes;
a first path providing a path through which current flows between the first and third nodes;
a second path providing a path through which current flows between the third and fourth nodes; and
a third path providing a path through which the output current flows,
the third path passes through a first position adjacent to the first path or passes through a second position adjacent to the second path, and
the current sensor is placed at a position corresponding to the first position or the second position such that the resultant current, which is the sum of the inductor current and the output current is sensed.

5. The uninterruptible power supply as claimed in claim 4, further comprising a controller configured to receive information about the resultant current sensed by the current sensor and restore the inductor current and the output current by separating the inductor current and the output current based on the information about the resultant current.

6. The uninterruptible power supply as claimed in claim 5, wherein the inverter periodically and repeatedly operates in a first mode and a second mode in such a manner that the inverter turns on the first and fourth switches and turns off the second and third switches in the first mode, and turns off the first and fourth switches and turns on the second and third switches in the second mode.

7. The uninterruptible power supply as claimed in claim 6, wherein the controller is configured to restore the inductor current and the output current by removing second resultant current sensed in the second mode from first resultant current sensed in the first mode.

\* \* \* \* \*